United States Patent
Kaynak et al.

(10) Patent No.: US 12,328,129 B2
(45) Date of Patent: Jun. 10, 2025

(54) BYPASSING ITERATIONS IN A BIT FLIPPING DECODER USING A LEAST RELIABLE BIT ENERGY FUNCTION

(71) Applicant: Micron Technology, Inc., Boise, ID (US)

(72) Inventors: Mustafa N. Kaynak, San Diego, CA (US); Eyal En Gad, Highland, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 18/502,664

(22) Filed: Nov. 6, 2023

(65) Prior Publication Data

US 2024/0154625 A1    May 9, 2024

Related U.S. Application Data

(60) Provisional application No. 63/423,909, filed on Nov. 9, 2022.

(51) Int. Cl.
*H03M 13/11*  (2006.01)
*H03M 13/37*  (2006.01)

(52) U.S. Cl.
CPC ... *H03M 13/1108* (2013.01); *H03M 13/3746* (2013.01)

(58) Field of Classification Search
CPC ......... H03M 13/1108; H03M 13/3746; G06F 11/10
See application file for complete search history.

(56) References Cited

U.S. PATENT DOCUMENTS

| | | | |
|---|---|---|---|
| 2021/0119643 A1 | 4/2021 | Xiong et al. | |
| 2021/0281278 A1* | 9/2021 | Lu | H03M 13/1111 |
| 2022/0006473 A1 | 1/2022 | Gad et al. | |
| 2022/0255561 A1 | 8/2022 | Kaynak et al. | |
| 2022/0294473 A1* | 9/2022 | Gad | G06F 11/1076 |

OTHER PUBLICATIONS

International Search Report and Written Opinion, PCT App. No. PCT/US2023/078820, Mar. 5, 2024, 09 pages.

* cited by examiner

*Primary Examiner* — Thien Nguyen
(74) *Attorney, Agent, or Firm* — NICHOLSON DE VOS WEBSTER & ELLIOTT LLP

(57) ABSTRACT

A bit flipping decoder receives a codeword stored in a memory device. The bit flipping decoder determines a plurality of energy function values for the codeword and a least reliable of the energy function values for the codeword. In response to the bit flipping decoder determining the least reliable energy function value fails to satisfy a bit flipping criterion of a current iteration, the bit flipping decoder increments an iteration count. The incrementing of the iteration count bypasses a comparison of the plurality of energy function values with the bit flipping criterion of the current iteration.

20 Claims, 5 Drawing Sheets

BYPASSING ITERATIONS IN A BIT FLIPPING DECODER USING A LEAST RELIABLE BIT ENERGY FUNCTION

CROSS-REFERENCE TO RELATED APPLICATION

The present application claims the benefit of U.S. Provisional Patent Application No. 63/423,909, filed on Nov. 9, 2022, which is hereby incorporated by reference.

TECHNICAL FIELD

The present disclosure generally relates to error correction in memory devices, and more specifically, relates to a bit flipping decoder using a least reliable bit energy function value to bypass one or more iterations of decoding.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
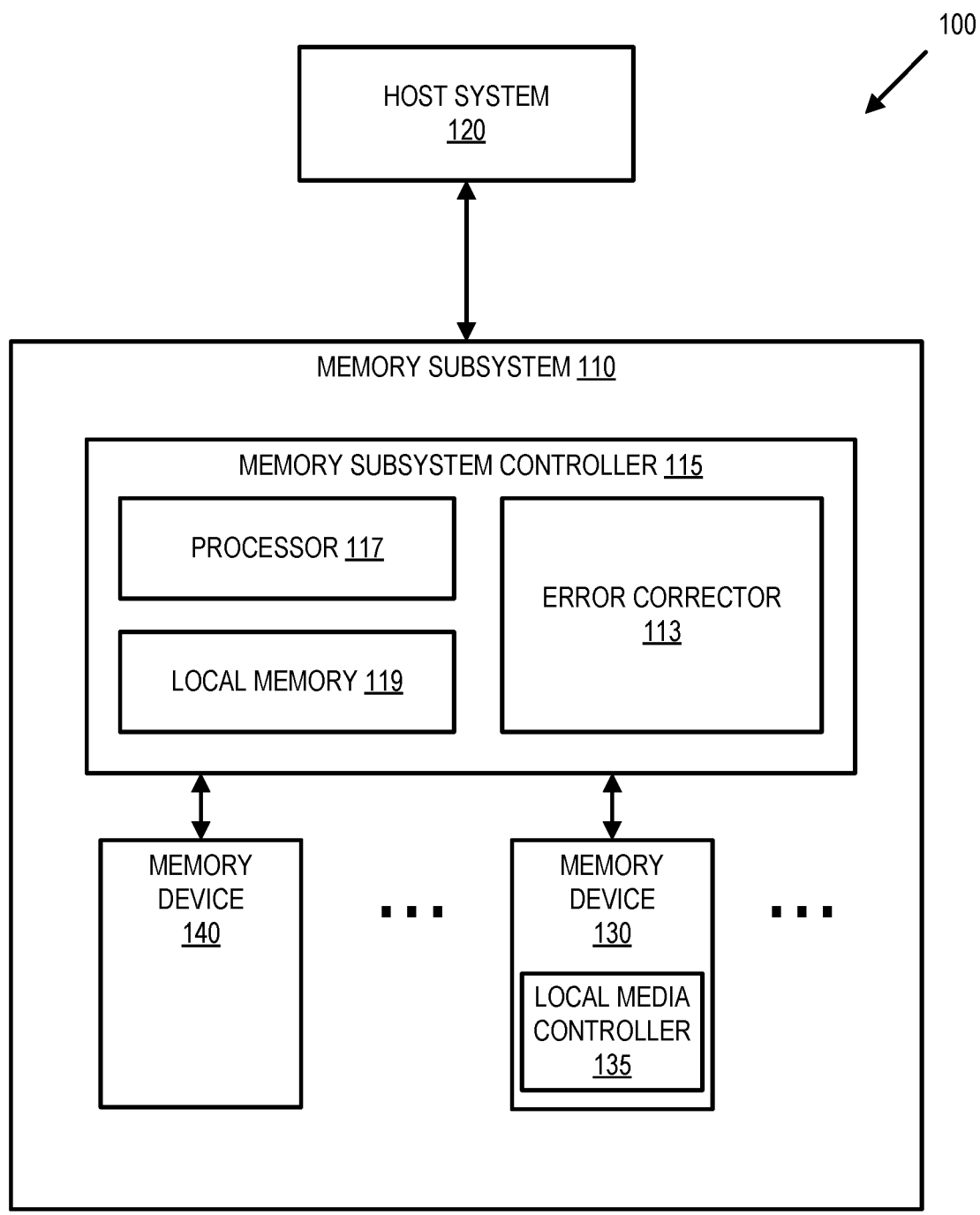
FIG. 1 illustrates an example computing system that includes a memory subsystem in accordance with some embodiments of the present disclosure.

Aspects of the present disclosure are directed to a bit flipping decoder using a least reliable bit energy function value to bypass one or more iterations of decoding in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, an SLC can store one bit of information and has two logic states.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to Shannon channel capacity. LDPC decoders utilize a "belief propagation" algorithm, which is based on the iterative exchange of reliability information, e.g., "beliefs." The MinSum algorithm (MSA), which is a simplified version of the belief propagation algorithm, can be used for decoding LDPC codes. MSA-based decoders use a relatively high amount of energy per bit (e.g., pico-joule per bit) for decoding codewords and hence are not well suited for energy conscious applications, such as mobile applications.

Bit Flipping (BF) decoders have been introduced to address this problem. BF decoders use less energy per bit with the tradeoff of a lower error correction capability than MSA-based decoders. In each iteration of decoding, a BF decoder evaluates each bit and flips the least reliable bits to correct errors. The least reliable bits are identified by comparison of a threshold value to an energy function value for each bit. Bit flipping thresholds can be determined, e.g., based on a heuristic process and/or optimized using machine learning algorithm. Additionally, bit flipping thresholds can vary between iterations of decoding. For a given iteration, the comparison of the energy function of each bit and the bit flipping threshold may not result in any bit flips. In other words, while one or more bits may be in error, no bit qualifies to be flipped using the current iteration's bit flipping threshold. These "no-flip iterations" result in longer decode times and lower decoder throughput.

Aspects of the present disclosure address the above and other deficiencies by utilizing a least reliable bit energy function value for a codeword and bypassing one or more iterations of a bit flipping decoding process when the least reliable bit energy function value does not satisfy the bit flipping threshold. The bit flipping decoder can, e.g., proceed to an iteration with a bit flipping threshold that is satisfied by the least reliable bit energy function value and will result in the decoder flipping one or more bits in the codeword. As a result, the bit flipping decoder can complete the decoding process with improved latency and reduced energy consumption.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130/140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an error corrector 113 that can encode and decode data stored in the memory device (e.g., an encoder and/or a decoder). In some embodiments, the controller 115 includes at least a portion of the error corrector 113. For example, the controller 115 can include a processor 117 (processing device) configured to execute instructions stored in local memory 119 for performing the operations described herein. In some embodiments, the error corrector 113 is part of the host system 120, an application, or an operating system.

Encoding data using an error correcting code (ECC) allows for correction of erroneous data bits when the data is retrieved from the memory device. For example, the error corrector 113 can encode data received from the host system 120 and store the data and parity bits as codewords in the memory device 130. The error corrector 113 can further decode data stored in the memory device 130 to identify and correct erroneous bits of the data before transmitting corrected data to the host system 120. Although illustrated as a single component that can perform encoding and decoding of data, the error corrector 113 can be/include separate components. In some embodiments, the error corrector 113 encodes data according to a low-density parity-check (LDPC) code.

The error corrector 113 decodes the codewords stored in the memory device 130 using a BF decoder. For example, the error corrector 113 receives a codeword stored in a memory device 130. The error corrector 113 error corrects the codeword in a set of iterations, e.g., by flipping bits for one or more iterations using energy function values for the bits. The energy function value of a codeword bit is an indication of reliability for the codeword bit. In some embodiments, an energy function value of a codeword bit is determined based on a number of parity violations per codeword bit and channel information. The channel information is determined based on a current state of the bit (e.g., after one or more iterations of the BF decoder) versus the state of the bit as read from the memory device (also referred to as hard bit). As described below, the error corrector 113 implements an enhanced BF decoder that can perform bit flipping decoding using a least reliable bit energy function value to efficiently bypass one or more iterations of decoding. Further details with regards to the operations of the error corrector 113 are described below.

Figure 2:
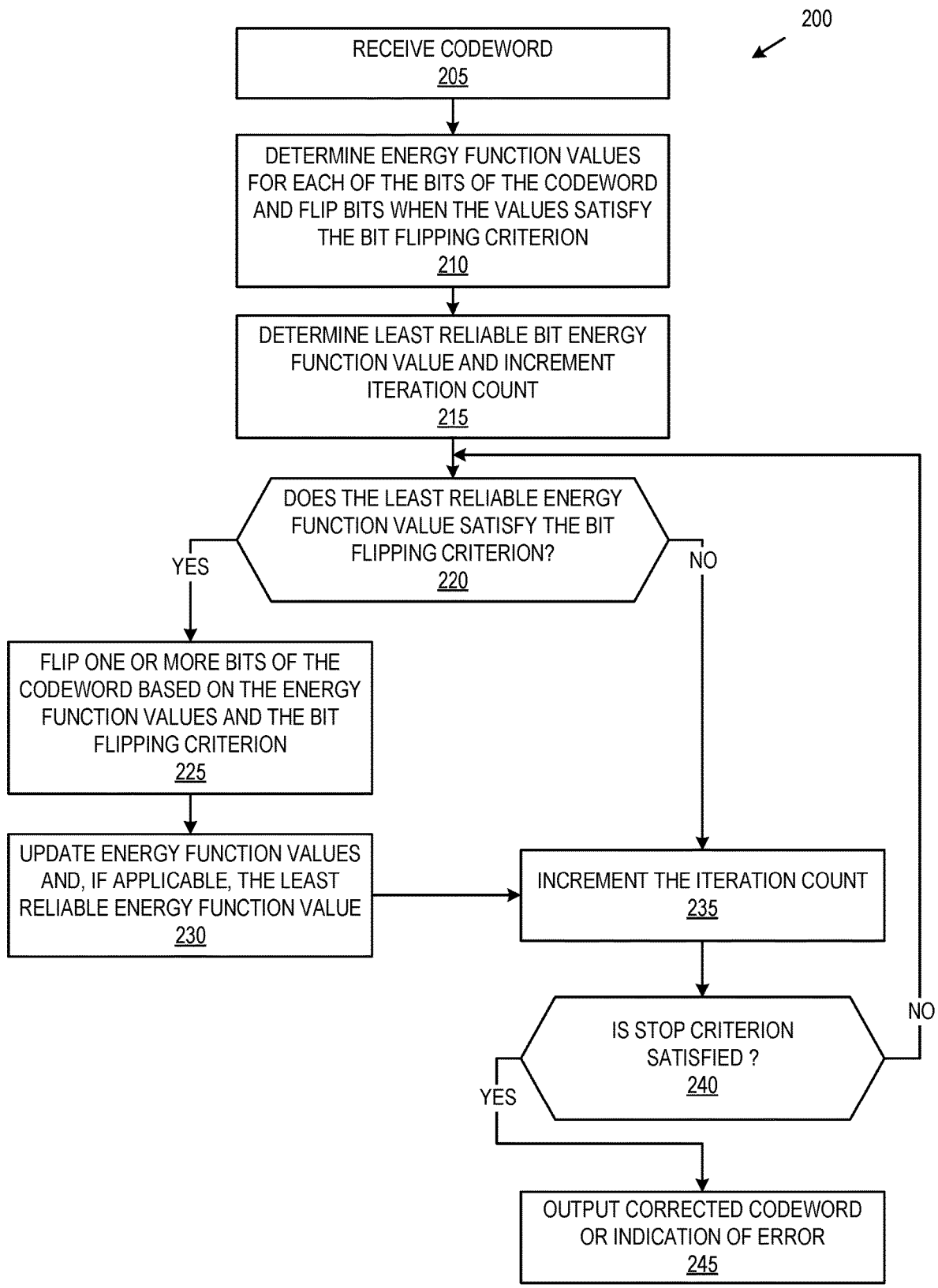
FIG. 2 is a flow diagram of an example method that provides bit flipping using a least reliable bit energy function value to bypass one or more iterations of decoding in accordance with some embodiments of the present disclosure.

FIG. 2 is a flow diagram of an example method 200 that provides bit flipping using a least reliable bit energy function value to bypass one or more iterations of decoding, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device receives a codeword from a memory device. In some embodiments, the codeword is received in the execution of a read operation from a host system 120. The codeword can include a combination of data bits and parity check bits. For example, each of the data bits and parity check bits is a hard bit that results from a read of a memory cell to determine the state of the memory cell (e.g., "0" or "1"). Additionally, each data bit can be verified by multiple parity bits.

In one embodiment, the processing device optionally receives soft information for the codeword. The soft information can include bits received from the memory device in addition to the bits of the codeword. In some embodiments, the memory device is operative to determine soft information for a hard read. In other embodiments, the memory device does not generate and does not transmit the soft information to the processing device. In some embodiments, the memory device generates and transmits soft information for some but not all codewords it transmits to the processing device. Soft information can indicate a confidence level with regards to a hard data bit. For example, soft information can indicate that there is a high confidence level with regards to a hard data bit and the hard data bit can be referred to as a strong bit. Alternatively, soft information can indicate that there is a low confidence level in the hard data bit and the hard data bit is referred to as a weak bit.

In some embodiments, soft information is indicative of a particular voltage to which the memory cell is charged (where the memory cell is the one from which the hard data bit is read). In these embodiments, a hard data bit is less reliable (i.e., a weak bit) when its associated soft information is indicative of the memory cell is charged to a particular voltage that is near a boundary between two states; and a hard data bit is more reliable (i.e., a strong bit) when its associated soft information indicates that the memory cell is charged to a particular voltage near the center of a voltage range corresponding to a state ("0" or "1").

In some embodiments, the soft information includes at most a soft bit for each bit of the hard data bit of the codeword. The soft bit of a hard data bit is indicative of whether the hard data bit is a strong or a weak bit. For example, the soft bit can be "0" when its associated hard data bit is weak and "1" when its associated hard data bit is strong. In some embodiments, the number of bits of soft information for a codeword is strictly less than the number of bits of the codeword. For example, the processing device can receive the indices of the strong bits in the codeword. Alternatively, the processing device can receive the indices of the weak bits in the codeword to reduce the amount of information transferred from memory device 130 to error corrector 113. In some embodiments, the soft information includes more than one soft bit for each bit of the hard data bit of the codeword. For example, when the soft information includes two soft bits, this results in four reliability levels for a bit such as very weak, weak, strong, and very strong.

At operation 210, the processing device determines energy function values for bits of the codeword. An energy function of a codeword bit is an indication of reliability information for the bit. The error corrector 113 can determine an energy function value for a bit of the codeword based on the number of unsatisfied parities for the bit and channel information for that bit. In some embodiments, a higher number of unsatisfied parities for a bit is an indication of a less reliable bit and results in a higher energy function value for the bit. Similarly, a lower number of unsatisfied parities (higher number of satisfied parities) for the bit is an indication of a more reliable bit and results in a lower energy function value for the bit. The channel information is determined based on a current state of the bit as compared to the state of the bit when it was read from a memory device. For example, the channel information of a bit can be defined as an XOR of the current state of the bit, which may have been flipped during one or more iterations of decoding, and the bit read as from the memory device. In such an example, the channel information has a value of "1" for a mismatch and "0" when the current state of the bit matches the state of the bit when read. When the current state of the bit agrees with the state of the bit when read from the memory device, the bit is considered to be more reliable. In a non-limiting example, an energy function can be determined according to equation (1):

$$e(bit) = NumberParityViolations(bit) + Channel information(bit) \quad (1)$$

An energy function value of a bit is lower when the current state of the bit agrees with the hard bit received from the memory device than when the current state of the bit does not agree with the hard bit. In one embodiment, the error corrector 113 determines the energy function value of a bit of the codeword by retrieving the energy function value from a look up table based on the number of parity violations for a bit and the channel information for the bit.

Additionally, the error corrector 113 can use soft information in determining the energy function. Continuing with the example values above of "1" as a soft bit value for a strong bit and "0" as a soft bit value for a weak bit, the energy function can, e.g., subtract the soft bit value from number of parity violations in addition to channel information.

Again, in the example above, a higher e(bit) value indicates a less reliable bit and lower e(bit) value indicates a more reliable bit. In other embodiments, a high energy function value of a bit is indicative of a more reliable bit and a low energy function value of a bit is indicative of a less reliable bit. In such an embodiment, an energy function can be determined, e.g., by adding the number of satisfied parities with the negative of the channel information value. In some embodiments, the error corrector 113 determines the energy function values using scalar values and/or weighted values in addition to parity and channel information. For example, different rows, columns, or other distinct locations within a memory can be determined to be more reliable or less reliable. As such, the error corrector 113 can scale or weight the energy function values for bits in those locations.

In addition to determining the energy function value for each bit, the processing device flips those bits that satisfy the bit flipping criterion for the iteration of the bit flipping decoder. For example, the error corrector 113 evaluates each bit of the codeword by comparing its energy function value to the bit flipping criterion of the current iteration to determine whether to flip the bit. When the energy function value of a bit of the codeword does not satisfy the bit flipping criterion, the error corrector 113 does not flip the bit. When the energy function value of a bit of codeword satisfies the bit flipping criterion, the error corrector 113 flips the bit. The bit flipping criterion can also be referred to herein as a bit flipping or energy function value threshold. The error corrector 113 determines to flip a bit when the energy function value of the bit satisfies the threshold. For example, the error corrector 113 can flip a bit when the energy function value of the bit is greater than or equal to the threshold and to not flip the bit when the energy function value of the bit is less than the threshold.

At operation 215, the processing device determines the energy function value of the least reliable bit in the codeword for the initial decoder iteration. For example, when a higher energy function value indicates a less reliable bit, the error corrector 113 determines a maximum value of the energy function values for the codeword. In one embodiment, the error corrector 113 uses a first energy function value as an initial maximum value, compares each current energy function value as determined to the maximum value, and updates the maximum value when the current energy function value exceeds the maximum value (e.g., as energy function values are determined in operation 210).

As the processing device flips bits in operation 210, the processing device updates energy function values for the codeword. For example, flipping one or more bits of the codeword can change the number of unsatisfied parities and/or channel information for the codeword. As a result, the error corrector 113 determines new energy function values for the bits. In one embodiment, the error corrector 113 determines updated energy function values for only those bits affected by the flipping of one or more bits and bypasses the determination of energy function values for bits that will have no change in energy function values. If applicable, the error corrector 113 also determines an updated value for the least reliable energy function value (e.g., a new maximum value).

Additionally, the processing device increments the iteration count to proceed to the next iteration. As described further below, the bit flipping criterion can differ between iterations. The error corrector 113 can use the current iteration count to look up or otherwise determine the current bit flipping criterion. Additionally, the error corrector 113 can use the iteration count to determine if a stop criterion is satisfied.

At operation 220, at the beginning of the current decoder iteration (i), the processing device determines whether the least reliable energy function value from the previous decoder iteration (i−1) satisfies a bit flipping criterion for a current iteration of the bit flipping decoding process. For example, when the maximum value of the energy function values for the codeword from the previous iteration (i−1) is greater than or equal to the bit flipping criterion, the error corrector 113 determines that at least one bit in the codeword is to be flipped in the current iteration. On the other hand, when the maximum value of the energy function values for the codeword from the previous iteration (i−1) is less than the bit flipping criterion, the error corrector 113 determines that no bits are to be flipped in the current iteration. When the least reliable energy function value satisfies the bit flipping criterion, the method 200 proceeds to operation 225 for the decoding process to flip one or more bits in the current iteration. When the least reliable energy function value fails to satisfy the bit flipping criterion, the error corrector 113 has determined that no bits will be flipped, bypasses the comparison of other energy function values for the codeword to the bit flipping criterion, and the method 200 proceeds to operation 235.

At operation 225, the processing device flips one or more bits of the codeword when the energy function values for a given bit of the codeword satisfies the bit flipping criterion. For example, similar to the description of operation 210, the error corrector 113 can traverse the codeword according to a predetermined order and evaluate each bit of the codeword by comparing its energy function value to the bit flipping criterion of the current iteration to determine whether to flip the bit. When the energy function value of a bit of the codeword does not satisfy the bit flipping criterion, the error corrector 113 does not flip the bit. When the energy function value of a bit of codeword satisfies the bit flipping criterion, the error corrector 113 flips the bit.

At operation 230, the processing device updates energy function values for the codeword. For example, flipping one or more bits of the codeword can change the number of unsatisfied parities and/or channel information for the codeword. As a result, the error corrector 113 determines new energy function values for the bits. In one embodiment, the error corrector 113 determines updated energy function values for only those bits affected by the flipping of one or more bits and bypasses the determination of energy function values for bits that will have no change in energy function values. If applicable, the error corrector 113 also determines an updated value for the least reliable energy function value (e.g., a new maximum value). As a result, the error corrector 113 keeps track of the energy value of the least reliable bit for each iteration and uses that energy function in one or more subsequent iterations to decide whether to skip the iteration (bypassing the comparison of other energy function values for the codeword to the bit flipping criterion) or not.

At operation 235, the processing device increments/increases the iteration count. As described further below, the bit flipping criterion can differ between iterations. The error corrector 113 can use the current iteration count to look up or otherwise determine the current bit flipping criterion. Additionally, the error corrector 113 can use the iteration count to determine if a stop criterion is satisfied.

At operation 240, the processing device determines whether a stop criterion is satisfied. A stop criterion can include an indication that no errors are detected for the codeword. In some embodiments, the stop criterion can include a null syndrome (i.e., zero unsatisfied parities) indicating that the codeword no longer includes erroneous bits. In some embodiments, the stop criterion can include a maximum number of iterations or a maximum amount of time. For example, the error corrector 113 is operative to perform the maximum number of iterations (e.g., 30 iterations, 40 iterations, 100 iterations, etc.), and when this number of iterations is reached, the error corrector 113 outputs the resulting corrected codeword. When the stop criterion is not satisfied, the error corrector 113 performs another iteration. For example, when the stop criterion is not satisfied, the method 200 returns to operation 220, and the error corrector 113 determines if the least reliable energy function value satisfies a bit flipping criterion for the subsequent iteration, which can differ between iterations (as described further below). When the stop criterion is satisfied, the method 200 proceeds to operation 245.

At operation 245, the processing device outputs the corrected codeword or an indication of failure if the processing device was unable to decode the codeword. For example, the error corrector 113 can transmit the corrected codeword or the indication of failure to the host 120. In one embodiment, the indication of failure triggers an escalation in the decoding process. For example, the error corrector 113 can use an MSA decoder to decode the codeword in response to the failure of the BF decoder.

Figure 3:
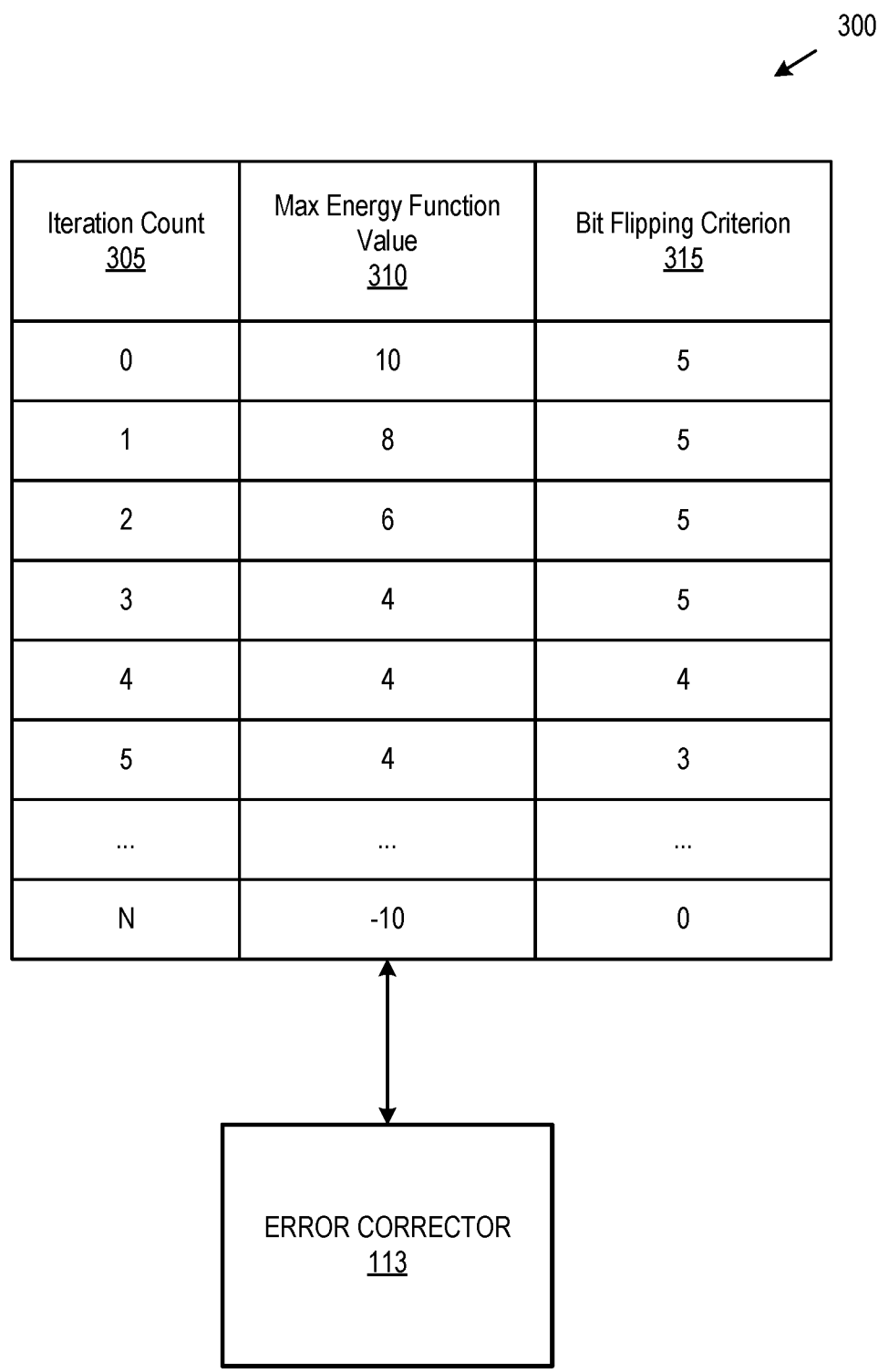
FIG. 3 illustrates a block diagram including an exemplary table of maximum energy function values and bit flipping thresholds for iterations of a bit flipping decoder in accordance with some embodiments.

FIG. 3 illustrates a block diagram including an exemplary table 300 of least reliable/maximum energy function values and bit flipping criterion for iterations of a bit flipping decoder, in accordance with some embodiments. Although FIG. 3 illustrates particular examples of iteration counts, maximum energy function values, and bit flipping criterion, the illustrated examples should be understood only as examples. Other mappings of iteration count to bit flipping criterion are possible.

Table 330 includes an iteration counts 305 from 0 to N, example maximum energy function values 310 per iteration, and a bit flipping criterion 315 per iteration. As described above, the error corrector 113 determines an energy function value for a bit based on its associated number of unsatisfied parities and channel information. Using the determined energy function values, the processing device determines a least reliable bit/energy function value 310 (e.g., the maximum energy function value) for the previous iteration (i−1), that will be used in the current iteration (i) to decide whether or not to bypass the comparison of other energy function values to the bit flipping criterion for the current iteration (i). The error corrector 113 can make this determination in the current iteration, as indicated by the iteration count 305, or in a previous iteration. In one embodiment, the error corrector 113 uses the table 300 or another data structure to map the current iteration count 305 to a corresponding bit flipping criterion 315. For example, the error corrector 113 can store and maintain a copy of the table 300 in a memory device 130/140 and/or in local memory 119.

Using the example values in the table 300, the maximum energy function value 310 satisfies (e.g., is greater than) the bit flipping criterion 315 in iterations 0, 1 and 2. In each of these iterations, the error corrector 113 compares the energy function values for the codeword to the bit flipping criterion and flips one or more bits accordingly. When the iteration count 305 reaches iteration 3, however, the maximum energy function value 310 does not satisfy the bit flipping criterion 315 (e.g., 4 is less than 5). As noted above, the maximum energy function value 310 of 4 for iteration 3 corresponds to the maximum energy value that is computed at iteration 2 for use in iteration 3. As a result, the error corrector 113 bypasses the comparison of codeword energy function values (other than the maximum) to the bit flipping criterion and proceeds to the next iteration. The bit flipping criterion 315 has decreased in value in iteration 4 as compared to iteration 3. In some embodiments, a maximum energy function value 310 equal to the bit flipping criterion 315 is determined to satisfy the bit flipping criterion 315. In other embodiments, a maximum energy function value 310 equal to the bit flipping criterion 315 is determined not to satisfy the bit flipping criterion 315 and iterations proceed with the bypassing of comparing energy function values to the bit flipping criterion 315 until the maximum energy function value 310 exceeds the bit flipping criterion 315, e.g., in iteration 5.

Figure 4:
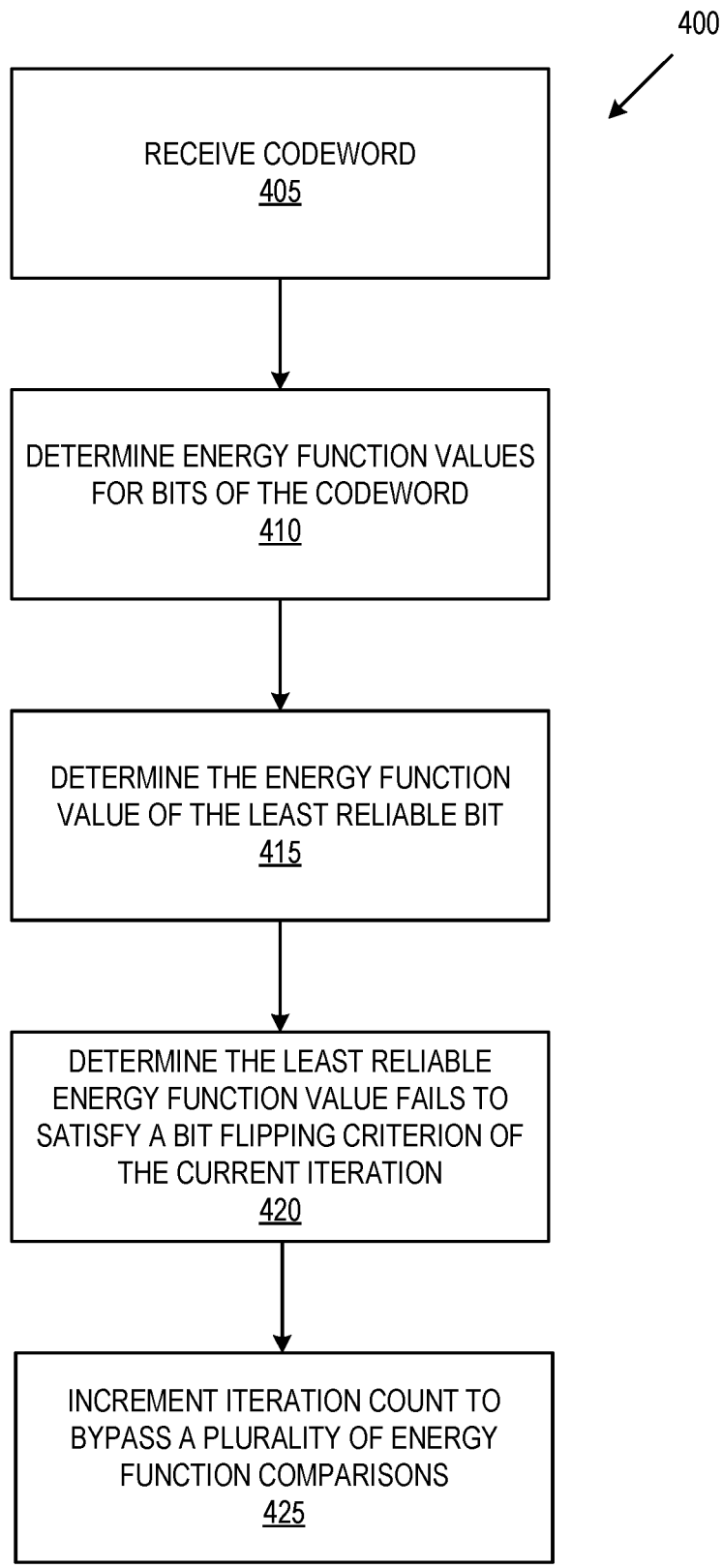
FIG. 4 is a flow diagram of another example method that provides bit flipping using a least reliable bit energy function value to bypass one or more iterations of decoding in accordance with some embodiments of the present disclosure.

FIG. 4 is a flow diagram of another example method 400 that provides bit flipping using a least reliable bit energy function value to bypass one or more iterations of decoding, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a codeword from a memory device. As described with reference to operation 205, the codeword can be received in the execution of a read operation from a host system 120 and includes a combination of data bits and parity check bits.

At operation 410, the processing device determines energy function values for bits of the codeword. For example, the processing device can determine an energy function value for a bit of the codeword using one or more of the number of unsatisfied parities for the bit, channel information for that bit, optional soft information, and/or a weight/scalar for the location of the bit within the memory device 130, as described with reference to operation 210.

At operation 415, the processing device determines the energy function value of the least reliable bit in the codeword. For example, the processing device determines a maximum value of the energy function values for the codeword as described with reference to operation 215.

At operation 420, the processing device determines the least reliable energy function value fails to satisfy a bit flipping criterion for a current iteration of the bit flipping decoding process. For example, the error corrector 113 maps the current iteration count to a bit flipping criterion, as described with reference to FIG. 3, and compares the least reliable energy function value to the bit flipping criterion as described with reference to operation 220 above.

At operation 425, the processing device, increments/increases the iteration count in response to determining the least reliable energy function value fails to satisfy a bit flipping criterion for a current iteration. As described above, the error corrector 113 saves processing power and time in bypassing the comparison of other energy function values for the codeword to the bit flipping criterion and proceeding to the next iteration.

Figure 5:
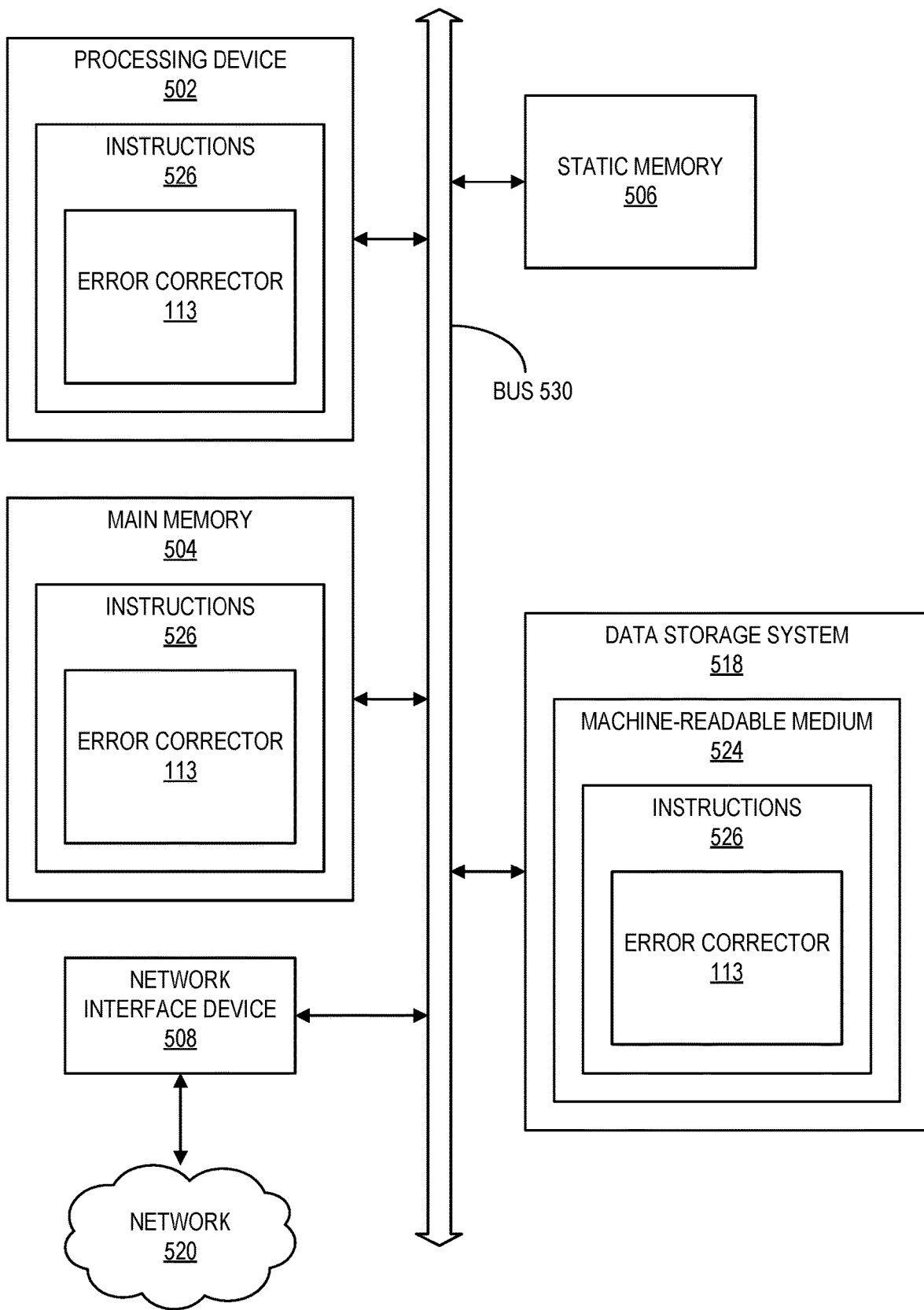
FIG. 5 is a block diagram of an example computer system in which embodiments of the present disclosure can operate.

FIG. 5 illustrates an example machine of a computer system 500 within which a set of instructions for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a bit flipping decoder (e.g., as implemented by the error corrector 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving a codeword stored in a memory device;
determining a plurality of energy function values for the codeword;
determining a least reliable of the energy function values for the codeword;
bypassing an iteration of a bit flipping decoding of the codeword by bypassing a comparison of the plurality of energy function values with a bit flipping criterion of a current iteration of the bit flipping decoding of the codeword responsive to determining the least reliable energy function value fails to satisfy the bit flipping criterion of the current iteration; and
incrementing an iteration count in response to bypassing the iteration of the bit flipping decoding.

2. The method of claim 1, wherein the bit flipping criterion of the current iteration differs from a bit flipping criterion of a subsequent iteration and the least reliable energy function value satisfies the bit flipping criterion of the subsequent iteration.

3. The method of claim 2, further comprising:
flipping a bit of the codeword in response to determining the energy function value for the bit satisfies the bit flipping criterion of the subsequent iteration.

4. The method of claim 1, further comprising:
determining the least reliable energy function value also fails to satisfy a bit flipping criterion of a subsequent iteration of a bit flipping decoding of the codeword; and
incrementing an iteration count again in response to determining the least reliable energy function value fails to satisfy the bit flipping criterion of the subsequent iteration.

5. The method of claim 1, wherein the least reliable energy function value was determined during a previous iteration of the bit flipping decoding of the codeword.

6. The method of claim 1, wherein the determining the energy function values for the codeword includes:
retrieving an energy function value for a bit of the codeword from a look up table using a number of unsatisfied parity checks and channel information indicating whether a current state of the bit is the same as a state of the bit as read from the memory device.

7. The method of claim 6, wherein the determining the energy function values for the codeword further includes using soft information associated with the bit of the codeword, wherein the soft bit indicates whether the bit of the codeword is strong or weak.

8. A non-transitory computer-readable storage medium comprising instructions that, when executed by a processing device, cause the processing device to:
receive a codeword stored in a memory device;
determine a plurality of energy function values for the codeword;
determine a least reliable of the energy function values for the codeword;
an iteration of a bit flipping decoding of the codeword by bypassing a comparison of the plurality of energy function values with a bit flipping criterion of a current iteration of the bit flipping decoding of the codeword responsive to determining the least reliable energy function value fails to satisfy the bit flipping criterion of the current iteration; and
increment an iteration count in response to bypassing the iteration of the bit flipping decoding.

9. The non-transitory computer-readable storage medium of claim 8, wherein the bit flipping criterion of the current iteration differs from a bit flipping criterion of a subsequent iteration and the least reliable energy function value satisfies the bit flipping criterion of the subsequent iteration.

10. The non-transitory computer-readable storage medium of claim 9, wherein the processing device is further to:
flip a bit of the codeword in response to determining the energy function value for the bit satisfies the bit flipping criterion of the subsequent iteration.

11. The non-transitory computer-readable storage medium of claim 8, wherein the processing device is further to:
determine the least reliable energy function value also fails to satisfy a bit flipping criterion of a subsequent iteration of a bit flipping decoding of the codeword; and
increment an iteration count again in response to determining the least reliable energy function value fails to satisfy the bit flipping criterion of the subsequent iteration.

12. The non-transitory computer-readable storage medium of claim 8, wherein the least reliable energy function value was determined during a previous iteration of the bit flipping decoding of the codeword.

13. The non-transitory computer-readable storage medium of claim 8, wherein the determining the energy function values for the codeword includes:
retrieving an energy function value for a bit of the codeword from a look up table using a number of unsatisfied parity checks and channel information indicating whether a current state of the bit is the same as a state of the bit as read from the memory device.

14. The non-transitory computer-readable storage medium of claim 13, wherein the determining the energy function values for the codeword further includes using soft information associated with the bit of the codeword, wherein the soft bit indicates whether the bit of the codeword is strong or weak.

15. A system comprising:
a memory device; and
a processing device, operatively coupled with the memory device, to:
receive a codeword stored in the memory device;
determine a plurality of energy function values for the codeword;
determine a least reliable of the energy function values for the codeword;
bypass an iteration of a bit flipping decoding of the codeword by bypassing a comparison of the plurality of energy function values with a bit flipping criterion of a current iteration of the bit flipping decoding of the codeword responsive to determining the least reliable energy function value fails to satisfy the bit flipping criterion of the current iteration, wherein the least reliable energy function value of the plurality of energy function values was determined during a previous iteration of the bit flipping decoding of the codeword; and
increment an iteration count in response to bypassing the iteration of the bit flipping decoding.

16. The system of claim 15, wherein the bit flipping criterion of the current iteration differs from a bit flipping criterion of a subsequent iteration and the least reliable energy function value satisfies the bit flipping criterion of the subsequent iteration.

17. The system of claim 16, wherein the processing device is further to:
flip a bit of the codeword in response to determining the energy function value for the bit satisfies the bit flipping criterion of the subsequent iteration.

18. The system of claim 15, wherein the processing device is further to:
determine the least reliable energy function value also fails to satisfy a bit flipping criterion of a subsequent iteration of a bit flipping decoding of the codeword; and
increment an iteration count again in response to determining the least reliable energy function value fails to satisfy the bit flipping criterion of the subsequent iteration.

19. The system of claim 15, wherein the determining the energy function values for the codeword includes:
retrieving an energy function value for a bit of the codeword from a look up table using a number of unsatisfied parity checks and channel information indicating whether a current state of the bit is the same as a state of the bit as read from the memory device.

20. The system of claim 19, wherein the determining the energy function values for the codeword further includes using soft information associated with the bit of the codeword, wherein the soft bit indicates whether the bit of the codeword is strong or weak.

\* \* \* \* \*